United States Patent
Shin (10) Patent No.: US 10,388,716 B2
(45) Date of Patent: Aug. 20, 2019

(54) ORGANIC LIGHT-EMITTING DISPLAY APPARATUS

(71) Applicant: Samsung Display Co., Ltd., Yongin-Si, Gyeonggi-Do (KR)

(72) Inventor: Hyejin Shin, Yongin-Si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/199,530

(22) Filed: Nov. 26, 2018

(65) Prior Publication Data

US 2019/0096981 A1    Mar. 28, 2019

Related U.S. Application Data

(60) Continuation of application No. 15/902,197, filed on Feb. 22, 2018, now Pat. No. 10,141,390, which is a division of application No. 14/991,613, filed on Jan. 8, 2016, now Pat. No. 9,923,043.

(30) Foreign Application Priority Data

May 1, 2015   (KR) .................. 10-2015-0062271

(51) Int. Cl.
H01L 27/32        (2006.01)
(52) U.S. Cl.
CPC .......... *H01L 27/3276* (2013.01); *H01L 27/32* (2013.01)

(58) Field of Classification Search
CPC ........................... H01L 27/32; H01L 27/3276
See application file for complete search history.

(56) References Cited

U.S. PATENT DOCUMENTS

| | | | |
|---|---|---|---|
| 2008/0118743 A1 | 5/2008 | Lee et al. | |
| 2013/0299790 A1 | 11/2013 | Kang et al. | |
| 2013/0306939 A1 | 11/2013 | Park et al. | |
| 2014/0319471 A1 | 10/2014 | Kim et al. | |

FOREIGN PATENT DOCUMENTS

| | | |
|---|---|---|
| KR | 1020080045886 | 5/2008 |
| KR | 1020130125294 | 11/2013 |
| KR | 1020130128940 | 11/2013 |
| KR | 1020140127630 | 11/2014 |

*Primary Examiner* — Douglas M Menz
(74) *Attorney, Agent, or Firm* — Cantor Colburn LLP (57) ABSTRACT

An organic light-emitting apparatus includes a substrate including an active area, a dead area, and a pad area, a display unit disposed in the active area and including thin-film transistors, pixel electrodes, and a portion of a common electrode, a first voltage supply unit disposed on the dead and pad areas and electrically contacting the common electrode, a second voltage supply unit overlapping the common electrode, and spaced apart and electrically insulated therefrom, and an insulating layer disposed between the common electrode and the second voltage supply unit, in which a portion of the common electrode that overlaps the first voltage supply unit is closer to the pad area than that of a portion of the common electrode that overlaps the second voltage supply unit, and an end portion of the insulating layer contacts an end portion of the first voltage supply unit adjacent to the active area.

10 Claims, 5 Drawing Sheets

ORGANIC LIGHT-EMITTING DISPLAY APPARATUS

CROSS-REFERENCE TO RELATED APPLICATION

This application is a continuation of U.S. patent application Ser. No. 15/902,197, filed on Feb. 22, 2018, which is a divisional of U.S. patent application Ser. No. 14/991,613, filed on Jan. 8, 2016, which claims priority from and the benefit of Korean Patent Application No. 10-2015-0062271, filed on May 1, 2015, which is hereby incorporated by reference for all purposes as if fully set forth herein.

BACKGROUND

Field

Exemplary embodiments relate to an organic light-emitting apparatus. More particularly, exemplary embodiments relate to an organic light-emitting apparatus with increased contact area between a common electrode and a voltage supply unit therein.

Discussion of the Background

An organic light-emitting apparatus is a display device that may include pixels and organic light-emitting devices. Light emission or a degree of light emission of each organic light-emitting device may be controlled by a thin-film transistor (TFT). The organic light-emitting device may include a pixel electrode, an intermediate layer including an emission layer, and a common electrode opposing the pixel electrode. A common electrode may be integrally formed on pixel electrodes and an intermediate layer, and receive a voltage from a voltage supply unit, which may electrically contact the common electrode and arranged outside a display area on which an image is displayed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting apparatus that may prevent unnecessary contact between a common electrode and a conductive layer and stably transmit a voltage to the common electrode.

Additional aspects will be set forth in the detailed description which follows, and, in part, will be apparent from the disclosure, or may be learned by practice of the inventive concept.

An exemplary embodiment discloses an organic light-emitting apparatus including a substrate including an active area, a dead area surrounding the active area, and a pad area in an outer region of the dead area, a display unit disposed in the active area, the display unit including thin-film transistors, pixel electrodes, and a portion of a common electrode, a first voltage supply unit disposed on the dead area and the pad area and electrically contacting the common electrode, the first voltage supply unit being configured to apply a first voltage to the common electrode, a second voltage supply unit overlapping the common electrode, spaced apart and electrically insulated therefrom, the second voltage supply unit being configured to apply a second voltage to the thin-film transistors, and an insulating layer disposed on the active area and the dead area, and between the common electrode and the second voltage supply unit, in which a first portion of the common electrode that overlaps the first voltage supply unit is closer to the pad area than a second portion of the common electrode that overlaps the second voltage supply unit, and an end portion of the insulating layer adjacent to the first voltage supply unit contacts an end portion of the first voltage supply unit adjacent to the active area.

An exemplary embodiment also discloses an organic light-emitting apparatus including a substrate including an active area, a dead area surrounding the active area, and a pad area in an outer region of the dead area, at least one thin-film transistor disposed in the active area, the at least one thin-film transistor including an active pattern, a gate electrode, a source electrode, and drain electrode, at least one pixel electrode disposed in the active area and electrically connected to one of the source electrode and the drain electrode, a common electrode facing the substrate and including a protrusion, the protrusion being disposed at an end portion of the common electrode adjacent to the pad area and extending towards the pad area, a first voltage supply unit disposed on the dead area and the pad area and contacting the protrusion of the common electrode, the first voltage supply unit being configured to apply a first voltage to the common electrode, a second voltage supply unit overlapping the common electrode, and spaced apart from and electrically insulated therefrom, and an insulating layer disposed over the active area and the dead area, and between the common electrode and the second voltage supply unit, in which the common electrode is disposed on the at least one thin film transistor and the at least one pixel electrode, and an end portion of the insulating layer adjacent to the first voltage supply unit contacts an end portion of the first voltage supply unit adjacent to the active area.

An exemplary embodiment further discloses a method of forming an organic light-emitting apparatus including forming an active area, a dead area surrounding the active area, and a pad area in an outer region of the dead area on a substrate, forming a thin-film transistor in the active area, forming a first voltage supply unit and a second voltage supply unit in the dead area, forming an insulation layer in the active area and the dead area, the insulation layer covering the thin-film transistor, the first voltage supply unit, and the second voltage supply unit, forming a pixel electrode on the insulation layer in the active area, removing a portion of the insulation layer covering the first voltage supply unit, forming a common electrode in the active area and the dead area, the common electrode covering the pixel electrode, the insulating layer, and an exposed portion of the first voltage supply unit, in which the pixel electrode, the common electrode, and the thin-film transistor form a display unit, the first voltage supply unit applies a first voltage to the common electrode and the second voltage supply unit applies a second voltage to the thin-film transistor, and the first voltage supply unit and the second voltage supply unit are disposed on the same layer with a drain electrode and source electrode of the thin-film transistor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
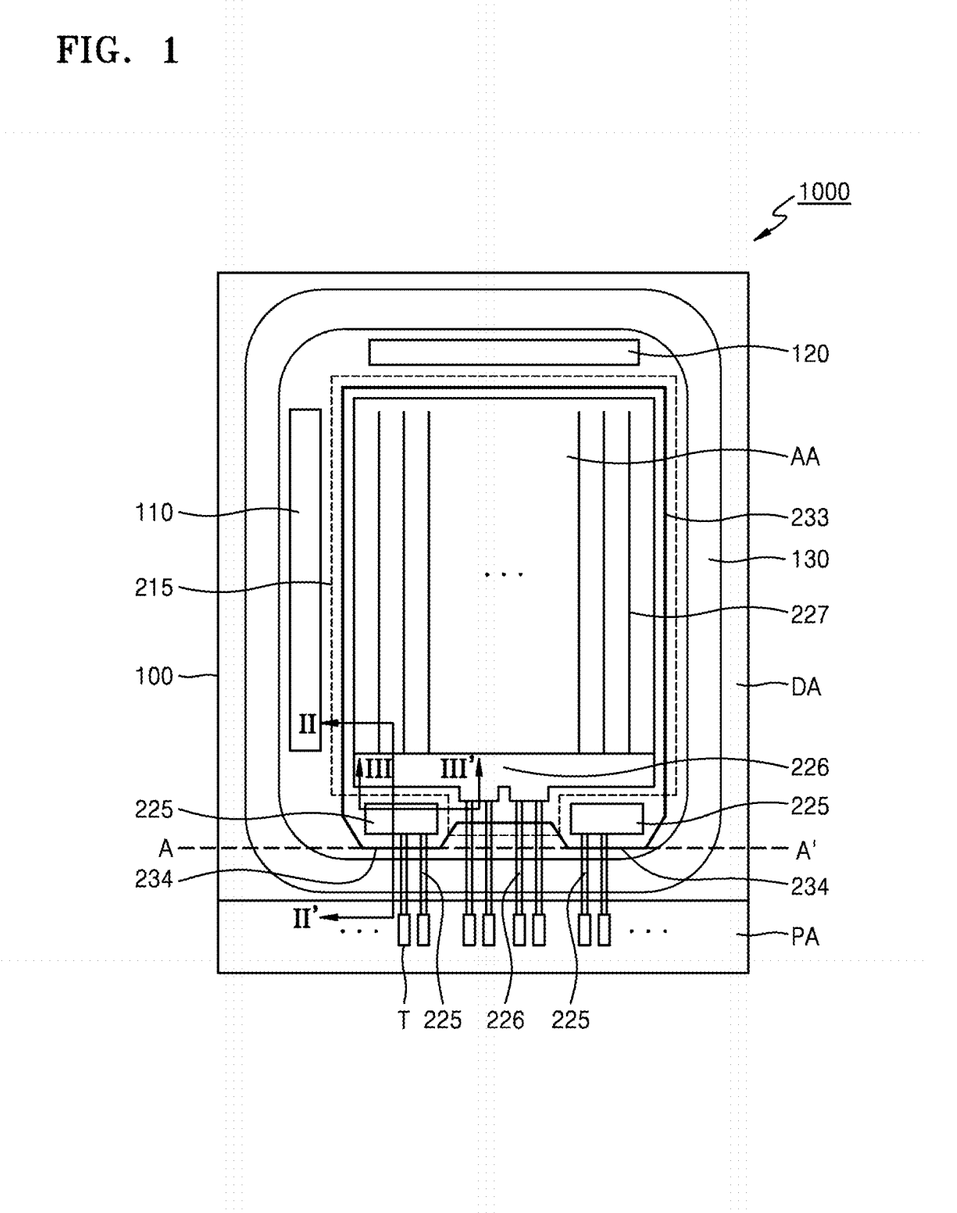
FIG. 1 is a schematic plan view of an organic light-emitting apparatus according to an exemplary embodiment.
Figure 2:
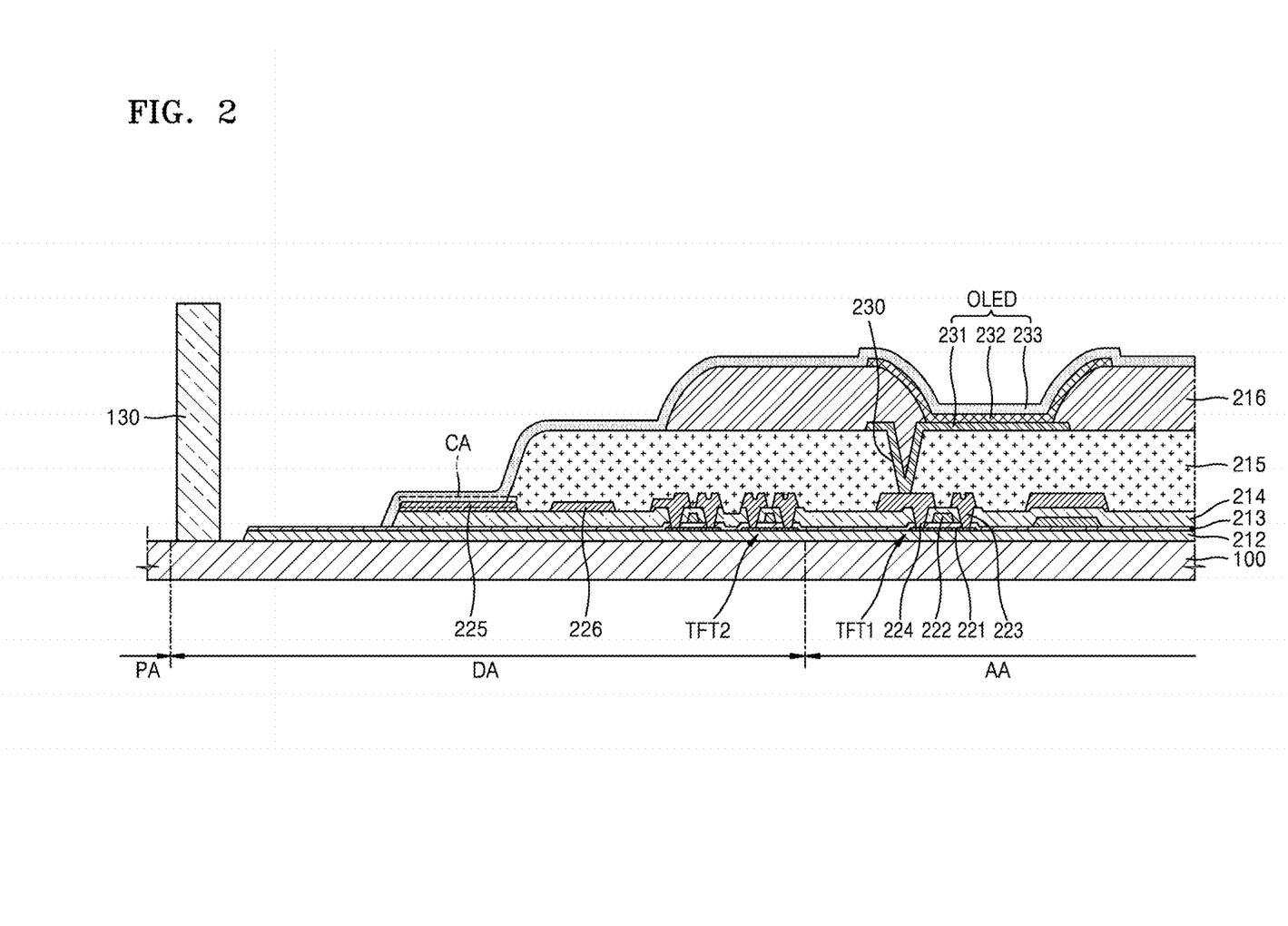
FIG. 2 is a cross-sectional view taken along line II-II' of FIG. 1.
Figure 3:
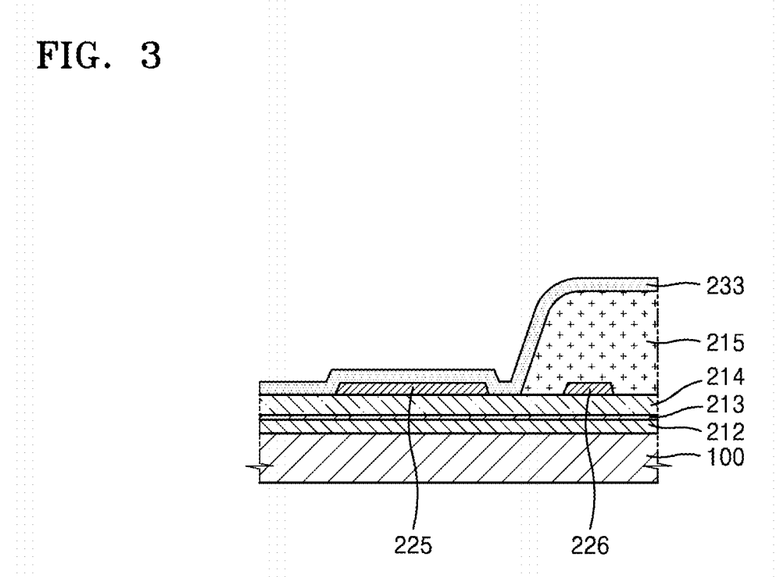
FIG. 3 is a cross-sectional view taken along line III-III' of FIG. 1.

FIG. 1 is a schematic plan view of an organic light-emitting apparatus 1000 according to an exemplary embodiment. FIG. 2 is a cross-sectional view taken along line II-II' of FIG. 1. FIG. 3 is a cross-sectional view taken along line III-III' of FIG. 1.

Referring to FIGS. 1 and 2, the organic light-emitting apparatus 1000 includes a substrate 100 including an active area AA, which is a display area, and a dead area DA, which is a non-display area.

Thin-film transistors TFT1 and organic light-emitting devices OLED electrically connected to the thin-film transistors TFT1 may be arranged in the active area AA of the substrate 100. Electrical connection between the OLED and the thin-film transistors TFT1 may mean that pixel electrodes 231 are electrically connected to the thin-film transistors TFT1. A thin-film transistor TFT2 may be arranged in the dead area DA surrounding the active area AA of the substrate 100. The thin-film transistor TFT2 may be a portion of a circuit unit for controlling an electrical signal applied in the active area AA.

A common electrode 233 may be disposed on the active area AA and the dead area DA of the substrate 100, and face the substrate 100, such that the thin-film transistors TFT1 and pixel electrodes 231 are disposed thereunder.

Various wires and driving units, which are connected to the wires and apply an electrical signal or voltage to the wires, may be disposed in the dead area DA of the substrate 100. More particularly, a scan driver 110 transmitting a scan signal to pixels via scan lines (not shown) and a data driver 120 transmitting a data signal to the pixels via data lines (not shown) may be disposed in the dead area DA. A first voltage supply unit 225 applying a first voltage to the common electrode 233 and a second voltage supply unit 226 applying a second voltage to the thin-film transistors TFT1 of the active area AA may be disposed in the dead area DA and a pad area PA.

Second voltage lines 227 are connected to the second voltage supply unit 226 and extend toward the dead area DA of the substrate 100 across the active area AA of the substrate 100. The second voltage lines 227 may be arranged in parallel to one another in the entire active area AA, to uniformly apply the second voltage to each pixel. The second voltage lines 227 may be connected to one another and have a mesh form, such that a voltage drop in the second voltage may be reduced. The first and second voltage supply units 225 and 226 extend toward the pad area PA of the substrate 100 and are connected to terminals T in the pad area PA.

A sealing member 130, which is separated from the common electrode 233 and surrounds the common electrode 233, may be arranged in the dead area DA of the substrate 100. The sealing member 130 seals the display area (i.e., active area AA) from an outer region of the common electrode 233, and thus may prevent external moisture, oxygen, other impurities, and the like, from penetrating into the display area.

The sealing member 130 may include frit. More particularly, the sealing member 130 may be formed by forming a paste including frit at a predetermined location of the substrate 100, and then melting and hardening the paste including the frit. The frit may include vanadium oxide ($VO_2$) or bismuth oxide ($Bi_2O_3$), and may further include various materials, such as at least one of tellurium dioxide ($TeO_2$), zinc oxide (ZnO), barium oxide (BaO), niobium pentoxide ($Nb_2O_5$), silicon oxide (SiOx), aluminum oxide ($Al_2O_3$), zirconium oxide ($ZrO_2$), and phosphorus pentoxide ($P_2O_5$). The sealing member 130 may also include fillers formed of various materials to improve sealing properties.

The organic light-emitting apparatus 1000 may further include a sealing medium, of which at least one insulating layer is stacked, in addition to the sealing member 130 surrounding the display area. The sealing medium may include at least one organic layer and/or at least one inorganic layer, and the at least one organic layer and the at least one inorganic layer may be alternately stacked. The sealing medium may effectively seal the display area and provide flexibility to a display apparatus.

Hereinafter, a structure of the organic light-emitting apparatus 1000 will be described in detail with reference to FIG. 2.

When the organic light-emitting apparatus 1000 is a bottom emission type, a displayed image may be viewed through the substrate 100. As such, the substrate 100 may be formed of a transparent glass that mainly includes silicon dioxide ($SiO_2$). Alternatively, the substrate 100 may be formed of transparent plastic including an insulating organic material.

When the organic light-emitting apparatus 1000 is a top emission type, a displayed image may be implemented in a direction opposite to the substrate 100. As such, the substrate 100 may not include a transparent material, and include metal.

The thin-film transistors TFT1 may be disposed in the active area AA of the substrate 100 and respectively include an active pattern 221, a gate electrode 222, a source electrode 223, and a drain electrode 224.

A buffer layer 212 may be formed on the substrate 100. The buffer layer 212 may prevent penetration of impurities into the substrate 100, and provide a flat surface to the substrate 100. The buffer layer 212 may include an inorganic material or organic material, and be formed of multiple layers.

The active pattern 221 may be formed of an inorganic semiconductor, such as silicon, or an organic semiconductor, and is disposed on the buffer layer 212. The active pattern 221 may include a source area, a drain area, and a channel area therebetween. When the active pattern 221 is formed of amorphous silicon, an amorphous silicon layer may be formed on the entire substrate 100, which is then crystallized and form a crystallized silicon layer. The crystallized silicon layer may be patterned, and the source area and the drain area disposed on edges of the active pattern 221 may be doped with impurities, such that the active pattern 221 including the source area, the drain area, and the channel area therebetween may be formed.

A gate insulating layer 213 may be formed on the active pattern 221. The gate insulating layer 213 may insulate the active pattern 221 from the gate electrode 222, and may be formed of an inorganic material, such as silicon nitride ($SiN_X$) or silicon dioxide ($SiO_2$).

The gate electrode 222 may be formed on a predetermined portion of the gate insulating layer 213. The gate electrode 222 is connected to the scan lines (not shown) transmitting on/off signals to the thin-film transistors TFT1, or the like. The gate electrode 222 may include gold (Au), silver (Ag), copper (Cu), nickel (Ni), platinum (Pt), palladium (Pd), aluminum (Al), and molybdenum (Mo), and alloy thereof, such as aluminum-neodymium (Al:Nd) and molybdenum-tungsten (Mo:W). Alternatively, the gate electrode 222 may be formed of various materials in consideration of a design.

An interlayer insulating layer 214 formed on the gate electrode 222 may insulate the gate electrode 222 from the source electrode 223 and the drain electrode 224. The interlayer insulating layer 214 may be a single layer or multiple layers including an inorganic material, such as $SiN_X$ or $SiO_2$.

The source electrode 223 and the drain electrode 224 may be formed on the interlayer insulating layer 214. More particularly, the interlayer insulating layer 214 and the gate insulating layer 213 may be formed to expose the source area and the drain area of the active pattern 221, and the source electrode 223 and the drain electrode 224 may be formed to contact the source area and the drain area of the active pattern 221 that are exposed.

The first voltage supply unit 225, the second voltage supply unit 226, and the second voltage lines 227 connected to the second voltage supply unit 226 may be formed on the same layer as the source electrode 223 and the drain electrode 224. The data lines (not shown) may be formed in parallel to the second voltage lines 227 and disposed on the same layer as the source electrode 223 and the drain electrode 224.

FIG. 2 illustrates the thin-film transistor TFT1 of a top gate type, which sequentially includes the active pattern 221, the gate electrode 222, the source electrode 223, and the drain electrode 224. According to an exemplary embodiment, the gate electrode 222 may be disposed under the active pattern 221.

An insulating layer 215 covering the source electrode 223 and the drain electrode 224 of the thin-film transistor TFT1 may be arranged to protect the thin-film transistor TFT1, etc. As such, the data lines and the second voltage lines 227 formed on the same layer as the source electrode 223 and the drain electrode 224, and the second voltage supply unit 226 connected to the second voltage lines 227 may be insulated by the insulating layer 215. The insulating layer 215 may include an organic material, such as poly(methyl methacrylate) (PMMA), a phenol-based polymer derivative, an acryl-based polymer, an imide-based polymer, an arylene ether-based polymer, an amide-based polymer, a fluorine-based polymer, a p-xylene-based polymer, a vinyl alcohol-based polymer, and any combination thereof. Alternatively, the insulating layer 215 may be formed of an inorganic material. When the insulating layer 215 is formed of an inorganic material, the insulating layer 215 may include silicon dioxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium oxide ($HfO_2$), zirconium oxide ($ZrO_2$), barium strontium titanate (BST), lead zirconate titanate (PZT), or the like. The insulating layer 215 may be a laminate, in which an inorganic insulating layer and an organic insulating layer are stacked.

A hole 230 may be formed in the insulating layer 215, such that a portion of the drain electrode 224 or source electrode 223 may be exposed.

The pixel electrode 231 may be formed on the insulating layer 215 and include a contact plug that covers a portion or the entire inner surface of the hole 230, or fills the hole 230. The pixel electrode 231 may be electrically connected to the drain electrode 224 or the source electrode 223 of the thin-film transistor TFT1 via the hole 230 formed in the pixel electrode 231. Accordingly, a driving current applied by the thin-film transistor TFT1 may flow to the OLED.

In the active area AA of the substrate 100, the OLED including the pixel electrode 231, the common electrode 233, and an intermediate layer 232 disposed therebetween and including an emission layer may be disposed on the insulating layer 215.

The pixel electrode 231 may be a transparent (translucent) electrode or a reflective electrode. When the pixel electrode 231 is the transparent (translucent) electrode, the pixel electrode 231 may include indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 231 is the reflective electrode, the pixel electrode 231 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), and a compound thereof, and a layer formed of ITO, IZO, ZnO, $In_2O_3$, IGO, or AZO. The pixel electrode 231 may have a single-layer structure or a multilayer structure.

A pixel-defining layer 216 may be disposed on the insulating layer 215. The pixel-defining layer 216 includes an opening corresponding to each sub-pixel, that is, an opening that exposes at least a central portion of the pixel electrode 231, and thus defining pixels. As illustrated in FIG. 2, the pixel-defining layer 216 may increase a distance between the end portion of the pixel electrode 231 and the common electrode 233 disposed on the pixel electrode 231, which may prevent electric arcs from occurring at an end portion of the pixel electrode 231. The pixel-defining layer 216 is disposed on the insulating layer 215, and the pixel-defining layer 216 may or may not be arranged in the dead area DA arranged on the outer region of the active area AA. The pixel-defining layer 216 may be formed of an organic material, including at least one of polyimide, polyamide, acryl resin, benzocyclobutene (BCB), and phenol resin, by a spin coating, or the like.

The intermediate layer 232 of the OLED may include a low-molecular material or high-molecular material. When the intermediate layer 232 includes a low-molecular material, the intermediate layer 232 may have a single-layer structure, including one of a hole injection layer (HIL), a hole transport layer (HTL), an emission layer (EML), an electron transport layer (ETL), an electron injection layer (EIL), or the like, or a multi-layer structure thereof. An organic material forming the intermediate layer 232 may vary, and include, for example, copper phthalocyanine (CuPc), N,N'-Di(naphthalene-1-yl)-N,N'-diphenyl-benzidine (NPB), tris-8-hydroxyquinoline aluminum (Alq3), or the like. The aforementioned layers may be formed by vacuum deposition.

When the intermediate layer 232 includes a high-molecular material, the intermediate layer 232 may have a structure including the HTL and the EML. In this case, the HTL may be formed of a high-molecular material, such as Poly(3,4-Ethylenedioxythiophene) (PEDOT), and the EML may be formed of a high-molecular material, such as a poly-phenylenevinylene (PPV)-based high-molecular material or a polyfluorene-based high-molecular material, by inkjet printing, laser induced thermal imaging (LITI), or the like.

The common electrode 233 may be disposed over the active area AA and the dead area DA. As illustrated in FIG. 1, the common electrode 233 may cover the active area AA. More particularly, the common electrode 233 may be integrally formed on the pixel electrode 231 and the intermediate layer 232 of each OLED, and may be an opposite electrode facing each pixel electrode 231.

The common electrode 233 may be a transparent (translucent) electrode or a reflective electrode. When the common electrode 233 is a transparent (translucent) electrode, the common electrode 233 may include a layer including metals having a low work function, such as lithium (Li), calcium (Ca), lithium fluoride/calcium (LiF)/Ca, lithium fluoride/aluminum (LiF/Al), aluminum (Al), magnesium (Mg), or a combination thereof, and a transparent (translucent) layer including ITO, IZO, ZnO, $In_2O_3$, or the like. When the common electrode 233 is a reflective electrode, the common electrode 233 may include a layer including Li, Ca, LiF/Ca, LiF/Al, Al, Mg, or a combination thereof.

Hereinafter, a shape and arrangement of the common electrode 233 will be described in detail with reference to FIGS. 1 to 3. First, the first and second voltage supply units 225 and 226 will be described.

The first voltage supply unit 225 that electrically contacts the common electrode 233 may be disposed in the dead area DA on the outer region of the active area AA of the substrate 100. The common electrode 233 may be disposed over the active area AA and the dead area DA of the substrate 100, and contacts at least a portion of the first voltage supply unit 225 arranged in the dead area DA, thereby receiving a first voltage from the first voltage supply unit 225.

As illustrated in FIG. 2, a surface of the common electrode 233 may directly contact a surface of the first voltage supply unit 225 in a contact area CA. Alternatively, the common electrode 233 may indirectly contact the first voltage supply unit 225 via a conductive layer disposed therebetween.

The larger a size of the contact area CA, the more smoothly a first voltage may be applied to the common electrode 233 by the first voltage supply unit 225. For example, an electric potential of the common electrode 233 may be constant, when the first voltage is constantly applied to the common electrode 233, or when the common electrode 233 is grounded. As such, increasing the size of the contact area CA between the first voltage supply unit 225 and the common electrode 233 may provide a stable surface contact, such that the electrical potential in the common electrode 233 may be constant.

Referring to FIG. 2, the following processes may be performed to enable sufficient contact between the common electrode 233 and the first voltage supply unit 225 in the contact area CA. In the dead area DA of the substrate 100, after the first voltage supply unit 225 and the second voltage supply unit 226 are formed on the same layer as the source and drain electrodes 223 and 224, the insulating layer 215 may be formed to cover the source and drain electrodes 223 and 224, the first voltage supply unit 225, and the second voltage supply unit 226. Then, a portion of the insulating layer 215 covering the first voltage supply unit 225, that is, an area above the first voltage supply unit 225 that is to be formed as the contact area CA, may be removed by etching, etc. In this case, a portion of the insulating layer 215 disposed above the second voltage supply unit 226 may remain, such as to prevent contact between the second voltage supply unit 226 and the common electrode 233, which otherwise may cause a short and damage a pixel circuit. Accordingly, the insulating layer 215 between the second voltage supply unit 226 and the common electrode 233 may prevent or reduce damage to the pixel circuit. After the pixel electrode 231 and the intermediate layer 232 are formed on the insulating layer 215, the common electrode 233 is disposed over the active area AA and the dead area DA of the substrate 100.

As illustrated in FIG. 2, through the above-described processes, in the dead area DA of the substrate 100, an end portion of the insulating layer 215 adjacent to the first voltage supply unit 225 may contact or partially overlap an end portion of the first voltage supply unit 225 that is adjacent to the active area AA. As a substantial portion of an upper surface of the first voltage supply unit 225 may be exposed by removing the portion of the insulating layer 215 disposed thereon, the common electrode 233 may cover the upper surface of the first voltage supply unit 225. Thus, the electric potential of the common electrode 233 receiving the first voltage from the first voltage supply unit 225 may be uniformly maintained, by sufficiently increasing the contact area CA between the common electrode 233 and the first voltage supply unit 225.

Referring back to FIG. 1, in the dead area DA of the substrate 100, when an area of the common electrode 233 is increased to line A-A' to cover most of the upper surface of the first voltage supply unit 225, the second voltage supply unit 226 may also be covered by the common electrode 233 to the line A-A'. In this case, an area of the insulating layer 215 disposed between the second voltage supply unit 226 and the common electrode 233 may also be increased to correspond to the increased common electrode 233 to the line A-A'. However, it may be difficult to increase an area of the insulating layer 215 in a direction towards the sealing member 130 disposed on a relatively outermost region of the dead area DA, which will be described in detail below.

According to the present exemplary embodiment, in the dead area DA of the substrate 100, a portion of the common electrode 233 above the first voltage supply unit 225 may have a shape different from a shape of a portion of the common electrode 233 above the second voltage supply unit 226.

In more detail, as illustrated in FIGS. 1 and 3, in the dead area DA of the substrate 100, a portion of the common electrode 233 that contacts the first voltage supply unit 225 may be closer to the pad area PA of the substrate 100 than a portion of the common electrode 233 that overlaps the second voltage supply unit 226. The portion of the common electrode 233 that contacts the first voltage supply unit 225 is disposed on different layers than the portion of the common electrode 233 that overlaps the second voltage supply unit 226. More particularly, the insulating layer 215 is disposed between the common electrode 233 and the second voltage supply unit 226.

As illustrated in FIG. 1, a protrusion 234 that protrudes toward the pad area PA may extend from an end portion of the common electrode 233 above the first voltage supply unit 225 adjacent to the pad area PA. The protrusion 234 of the common electrode 233 may extend from the portion of the common electrode 233 that contacts the first voltage supply unit 225, but the protrusion 234 may not be formed on the portion of the common electrode 233 that overlaps the second voltage supply unit 226. Also, as illustrated in FIG. 3, the insulating layer 215 may not be arranged on the portion of the common electrode 233 that contacts the first voltage supply unit 225, but is arranged on the portion of the common electrode 233 that overlaps the second voltage supply unit 226. Therefore, since the common electrode 233 contacts the first voltage supply unit 225 without contacting the second voltage supply unit 226, the first voltage may be stably applied to the common electrode 233.

Hereinafter, an effect of the shape and arrangement of the common electrode 233 will be described in detail with reference to FIGS. 4 and 5.

Figure 4:
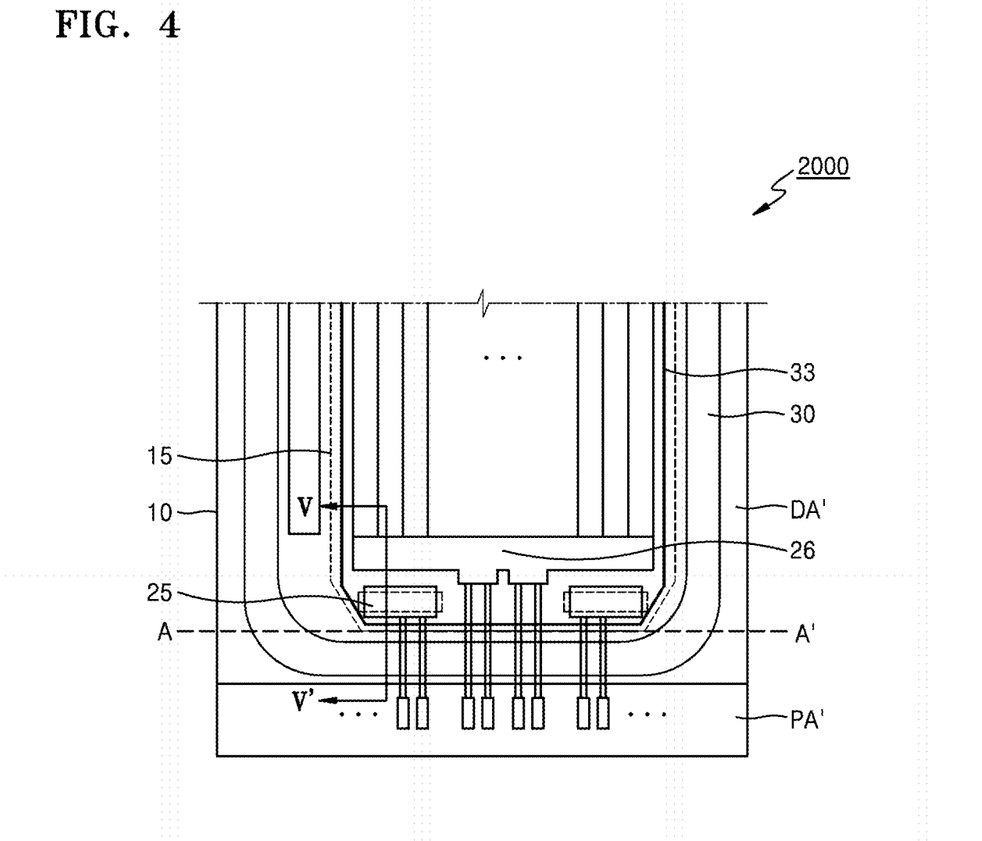
FIG. 4 is a schematic plan view of a portion of an organic light-emitting apparatus according to a comparative embodiment.

FIG. 4 is a schematic plan view of a portion of an organic light-emitting apparatus 2000 according to a comparative embodiment. FIG. 5 is a cross-sectional view taken along line V-V' of FIG. 4.

As described above, a contact area between the common electrode 233 and the first voltage supply unit 255 may be increased, to smoothly apply the first voltage to a common electrode 233, such that the electric potential in the common electrode 233 may be constant.

In the comparative embodiment, as illustrated in FIG. 4, the common electrode 33 covers upper portions of a first voltage supply unit 25 and a second voltage supply unit 26 to line A-A'. In a dead area DA' of a substrate 10, an insulating layer 15 may be formed to line A-A', which may correspond to an end portion of the first voltage supply unit 25 adjacent to a pad area PA'. However, when the insulating layer 15 extends to line A-A', the insulating layer 15 may be damaged while forming a sealing member 30 disposed outside the insulating layer 15 in the dead area DA' of the substrate 10, which may deteriorate a thin-film transistor TFT1' formed under the insulating layer 15.

More particularly, the insulating layer 15 may have a greater thickness than other insulating layers 13 and 14, to flatten uneven portions generated during forming the thin-film transistor TFT1', such that the insulating layer 15 may cover and protect the thin-film transistor TFT1'. As such, the insulating layer 15 may include an organic material. However, when the sealing member 30 is formed to surround an outer side of the insulating layer 15 in the dead area DA' of the substrate 10, if a distance between the insulating layer 15 and the sealing member 30 is less than a minimum distance, the insulating layer 15 including an organic material may be easily deteriorated by heat applied to the frit, etc., during the formation of the sealing member 30. Accordingly, the insulating layer 15 and the sealing member 30 surrounding the outer side of the insulating layer 15 should be spaced apart from each other, in the dead area DA' of the substrate 10.

Figure 5:
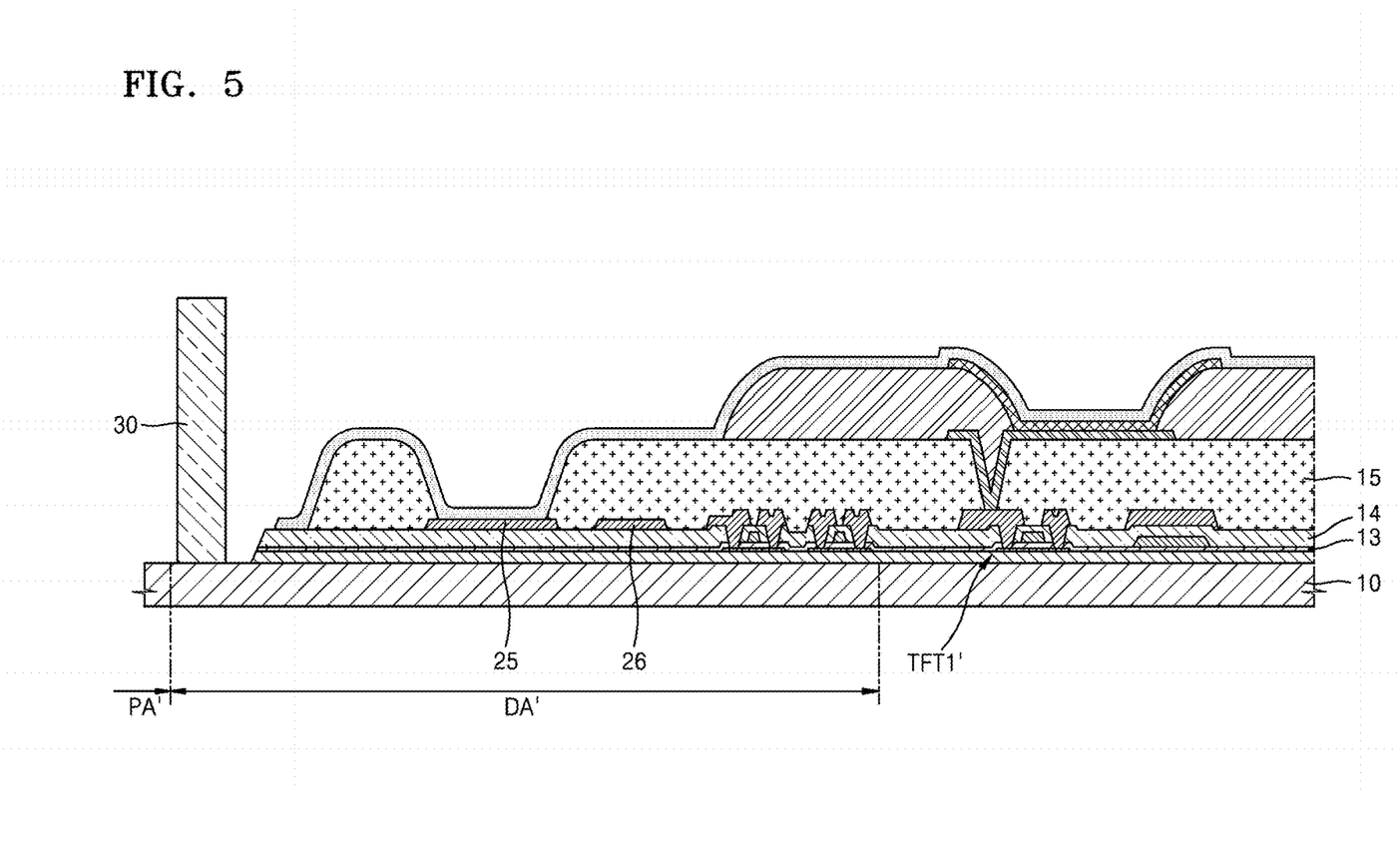
FIG. 5 is a cross-sectional view taken along line V-V' of FIG. 4.

According to the comparative embodiment of FIGS. 4 and 5, when the insulating layer 15 is formed to line A-A' corresponding to the end portion of the first voltage supply unit 25 adjacent to the pad area PA', the insulating layer 15 may be not be sufficiently spaced apart from the sealing member 30, which may damage the insulating layer 15.

The organic light-emitting apparatus 1000 according to an exemplary embodiment includes the display apparatus illustrated with reference to FIGS. 1 and 2, to increase the contact area CA between the first voltage supply unit 225 and the common electrode 233, without increasing an area of the insulating layer 215 in the dead area DA of the substrate 100. More particularly, a portion of the common electrode 233 that contacts an upper portion of the first voltage supply unit 225 may protrude toward the sealing member 130, and a portion of the common electrode that contacts the upper portion of the second voltage supply unit 226, in which the insulating layer 215 is disposed therebetween, is relatively separated apart from the sealing member 130. As such, the first voltage may be smoothly applied to the common electrode 233 by the first voltage supply unit 225.

Thus, according to an exemplary embodiment of the present inventive concept, an electrical connection between a common electrode and a voltage supply unit may be smoothly established, and thus, an organic light-emitting apparatus may stably apply a voltage to the common electrode. In addition, an organic light-emitting apparatus may prevent unnecessary contact between a common electrode and a conductive layer.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An organic light-emitting apparatus, comprising:
   a substrate comprising an active area and a pad area in an outer region of the active area;
   at least one thin-film transistor disposed in the active area;
   at least one pixel electrode disposed in the active area and electrically connected to the at least one thin-film transistor;
   a common electrode facing the substrate and comprising a protrusion, the protrusion being disposed at an end portion of the common electrode adjacent to the pad area and extending towards the pad area;
   a first voltage supply unit disposed between the active area and the pad area and contacting the protrusion of the common electrode, the first voltage supply unit being configured to apply a first voltage to the common electrode;
   a second voltage supply unit overlapping the common electrode, and spaced apart and electrically insulated therefrom; and
   an insulating layer disposed between the common electrode and the second voltage supply unit,
   wherein the common electrode is disposed on the at least one thin-film transistor and the at least one pixel electrode.

2. The organic light-emitting apparatus of claim 1, further comprising second voltage lines extending from the second voltage supply unit and across the active area,
   wherein the second voltage supply unit is configured to apply a second voltage to the at least one thin-film transistor via at least one of the second voltage lines.

3. The organic light-emitting apparatus of claim 1, wherein a portion of the second voltage supply unit disposed does not overlap the protrusion.

4. The organic light-emitting apparatus of claim 1, wherein a portion of the first voltage supply unit disposed does not overlap the insulating layer.

5. The organic light-emitting apparatus of claim 1, wherein the protrusion is disposed on the first voltage supply unit.

6. The organic light-emitting apparatus of claim 1, wherein the insulating layer comprises an organic material.

7. The organic light-emitting apparatus of claim 1, further comprising a sealing member disposed in outside the active area,
   wherein the sealing member is spaced apart from the common electrode and the insulating layer, and surrounds the common electrode and the insulating layer.

8. The organic light-emitting apparatus of claim 1, wherein the at least one thin-film transistor comprise an active pattern, a gate electrode, a source electrode, and drain electrode, wherein the first voltage supply unit and the second voltage supply unit are disposed on the same layer as the source electrode and the drain electrode of the at least one thin-film transistor.

9. The organic light-emitting apparatus of claim 1, wherein an end portion of the insulating layer adjacent to the first voltage supply unit contacts an end portion of the first voltage supply unit adjacent to the active area.

10. The organic light-emitting apparatus of claim 1, wherein the protrusion comprises a first protrusion and a second protrusion,
    wherein the insulating layer comprises an insulating-protrusion, the insulating-protrusion is disposed between the first protrusion and the second protrusion.

* * * * *